(12) United States Patent
Takada et al.

(10) Patent No.: US 8,901,605 B2
(45) Date of Patent: Dec. 2, 2014

(54) SEMICONDUCTOR WAFER, SEMICONDUCTOR DEVICE, AND METHOD OF PRODUCING SEMICONDUCTOR WAFER

(71) Applicants: Sumitomo Chemical Company, Limited, Chuo-ku, Tokyo (JP); National Institute of Advanced Industrial Science and Technology, Chiyoda-ku, Tokyo (JP)

(72) Inventors: Tomoyuki Takada, Ibaraki (JP); Sadanori Yamanaka, Ibaraki (JP); Masao Shimada, Ibaraki (JP); Masahiko Hata, Ibaraki (JP); Taro Itatani, Ibaraki (JP); Hiroyuki Ishii, Ibaraki (JP); Eiji Kume, Ibaraki (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 14/018,884

(22) Filed: Sep. 5, 2013

(65) Prior Publication Data
US 2014/0008698 A1   Jan. 9, 2014

Related U.S. Application Data

(63) Continuation-in-part of application No. PCT/JP2012/001502, filed on Mar. 5, 2012.

(30) Foreign Application Priority Data

Mar. 7, 2011  (JP) .................................. 2011-049565

(51) Int. Cl.
*H01L 31/0328*   (2006.01)
*H01L 31/108*    (2006.01)
(Continued)

(52) U.S. Cl.
CPC .......... *H01L 31/032* (2013.01); *H01L 31/1085* (2013.01); *H01L 29/24* (2013.01); *H01L 31/09*
(Continued)

(58) Field of Classification Search
CPC .............. H01L 31/032; H01L 31/1812; H01L 31/1844
USPC ................................ 257/184, 76; 438/94, 509
See application file for complete search history.

(56) References Cited

U.S. PATENT DOCUMENTS 4,614,564 A    9/1986  Sheldon et al.
7,928,471 B2 * 4/2011  Mastro et al. ................. 257/184
(Continued)

FOREIGN PATENT DOCUMENTS

JP   56-111270 A   9/1981
JP   60-210831 A   10/1985
(Continued)

OTHER PUBLICATIONS

International Preliminary Report on Patentability and Written Opinion for International Application No. PCT/JP2012/001502.
(Continued)

*Primary Examiner* — Tu-Tu Ho
(74) *Attorney, Agent, or Firm* — Sughrue Mion, PLLC

(57) ABSTRACT

There is provided a semiconductor wafer including a base wafer whose surface is entirely or partially a silicon crystal plane, an inhibitor positioned on the base wafer to inhibit crystal growth and having an opening that reaches the silicon crystal plane, a first crystal layer made of $Si_xGe_{1-x}$ ($0 \leq x < 1$) and positioned on the silicon crystal plane that is exposed in the opening, a second crystal layer positioned on the first crystal layer and made of a III-V Group compound semiconductor that has a band gap width larger than a band gap width of the first crystal layer, and a pair of metal layers positioned on the inhibitor and the second crystal layer. The pair of the metal layers are each in contact with the first crystal layer and the second crystal layer.

15 Claims, 7 Drawing Sheets

(51) Int. Cl.
  *H01L 29/24* (2006.01)
  *H01L 31/032* (2006.01)
  *H01L 31/09* (2006.01)
  *H01L 31/18* (2006.01)
  *H01L 31/036* (2006.01)

(52) U.S. Cl.
  CPC ..... (2013.01); *H01L 31/1844* (2013.01); *Y02E 10/544* (2013.01); *H01L 31/1804* (2013.01); *Y02E 10/547* (2013.01); *H01L 31/036* (2013.01)
  USPC ................ 257/184; 257/76; 438/94; 438/509

(56) References Cited

U.S. PATENT DOCUMENTS

| | | |
|---|---|---|
| 2008/0070355 A1 | 3/2008 | Lochtefeld et al. |
| 2010/0308376 A1 | 12/2010 | Takada et al. |
| 2011/0006343 A1 | 1/2011 | Hata et al. |
| 2011/0006368 A1 | 1/2011 | Hata et al. |
| 2011/0006399 A1 | 1/2011 | Takada et al. |
| 2011/0012175 A1 | 1/2011 | Takada et al. |
| 2011/0018030 A1 | 1/2011 | Takada et al. |
| 2011/0037099 A1 | 2/2011 | Takada et al. |
| 2011/0038675 A1 | 2/2011 | Nakaji et al. |
| 2011/0180849 A1 | 7/2011 | Hata |
| 2011/0180903 A1 | 7/2011 | Hata |
| 2011/0186911 A1 | 8/2011 | Hata |
| 2011/0266595 A1 | 11/2011 | Hata |
| 2012/0138898 A1 | 6/2012 | Hata et al. |

FOREIGN PATENT DOCUMENTS

| | | |
|---|---|---|
| JP | 61-094318 A | 5/1986 |
| JP | 61-188927 A | 8/1986 |
| JP | 05-251725 A | 9/1993 |
| JP | 11-340481 A | 12/1999 |
| JP | 2006-093338 A | 4/2006 |

OTHER PUBLICATIONS

International Search Report for PCT/JP2012/001502 dated Apr. 3, 2012.

* cited by examiner

SEMICONDUCTOR WAFER, SEMICONDUCTOR DEVICE, AND METHOD OF PRODUCING SEMICONDUCTOR WAFER

The contents of the following Japanese patent application and PCT patent application are incorporated herein by reference:
NO. 2011-049565 filed in JP on Mar. 7, 2011, and
PCT/JP2012/001502 filed on Mar. 5, 2012.

TECHNICAL FIELD

The present invention relates to a semiconductor wafer, a semiconductor device, and a method of producing a semiconductor wafer.

BACKGROUND ART

Patent Document 1 describes a light receiving element that has a metal-semiconductor-metal (MSM) structure, and a manufacturing method thereof. A layer formed of non-doped InGaAs is described as a light-absorbing layer of the light receiving element in Patent Document 1. The above mentioned Patent Document 1 is JP-11-340481A.

SUMMARY OF THE INVENTION

Problem to be Solved by the Invention

One of characteristics required for a light receiving element with a MSM structure is a fast response characteristic (high-frequency response characteristic). The fast response characteristic can be effectively enhanced by increasing the carrier mobility in a light-absorbing layer. In this respect, a III-V Group compound semiconductor with a fine crystallinity is preferably used for the light-absorbing layer. Moreover, it is preferable to use a silicon wafer as a base wafer in order to reduce a manufacturing cost of the III-V Group compound semiconductor that has a fine crystallinity. It is an object of the invention to provide a semiconductor wafer in which a silicon wafer is used as a base wafer and with which a MSM light receiving element (a photoconductive switch) that provides a better performance can be produced.

Means for Solving Problem

For a solution to the above-mentioned problems, according to the first aspect related to the present invention, provided is one exemplary semiconductor wafer. The semiconductor wafer includes a base wafer whose surface is entirely or partially a silicon crystal plane, an inhibitor positioned on the base wafer to inhibit crystal growth, and having an opening that reaches the silicon crystal plane, a first crystal layer made of $Si_xGe_{1-x}$ ($0 \leq x < 1$) and positioned on the silicon crystal plane that is exposed in the opening, a second crystal layer positioned on the first crystal layer and made of a III-V Group compound semiconductor that has a band gap width larger than a band gap width of the first crystal layer, and a pair of metal layers positioned on the inhibitor and the second crystal layer. The pair of the metal layers are each in contact with the first crystal layer and the second crystal layer.

The semiconductor wafer may further include an insulating portion electrically insulating the pair of the metal layers from each other and positioned on the second crystal layer. The insulating portion may be made of an oxide or a nitride of a metal atom of the metal layers. For example, a shorter side of the insulating portion is 1 µm or less. The metal layers are made of, for example, a metal of a single atom selected from the group consisting of titanium, niobium, chromium, aluminum, hafnium and zirconium, or an alloy of two or more atoms selected from the group described above. The inhibitor may have a plurality of openings. In this case, the first crystal layer and the second crystal layer may be provided at each of the plurality of openings, and a plurality of the first crystal layers and the second crystal layers may each have the pair of metal layers.

According to the second aspect related to the present invention, provided is a semiconductor device that includes the above-described semiconductor wafer. The device includes a photoconductive switch in which the first crystal layer and the second crystal layer serve as photoconductive layers, and the pair of metal layers serve as a pair of electrodes.

The inhibitor may have, at a position different from the opening in which the photoconductive switch is positioned, another opening other than the opening in which the photoconductive switch is positioned. The semiconductor device may further include the first crystal layer and the second crystal layer positioned at said another opening, and an active element in which the second crystal layer positioned at said another opening or another crystal layer formed on the second crystal layer positioned at said another opening serves as active layer. The photoconductive switch and the active element may be connected to each other via a wiring line positioned on the inhibitor.

When the above-described inhibitor of the semiconductor wafer has a plurality of openings at each of which the first crystal layer and the second crystal layer are provided, and a plurality of first crystal layers and second crystal layers each have a pair of the metal layers, the semiconductor device may have a plurality of photoconductive switches in which the plurality of the first crystal layers and the second crystal layers each serve as photoconductive layers, and the plurality of the pair of metal layers each serve as a pair of electrodes. The plurality of photoconductive switches may be arranged in an array.

The inhibitor may have, at positions different from the openings in which the plurality of photoconductive switches are positioned, a plurality of other openings other than the openings in which the plurality of the photoconductive switches are positioned. In this case, there may be further included a plurality of the first crystal layers and the second crystal layers each positioned at the plurality of said other openings, and a plurality of active elements in which the second crystal layers positioned at the plurality of said other openings or other crystal layers formed on the second crystal layers positioned at the plurality of said other openings serve as active layers. The plurality of the photoconductive switches and the plurality of active elements may be each connected to each other via a plurality of wiring lines positioned on the inhibitor.

According to the third aspect related to the present invention, provided is a method of manufacturing a semiconductor wafer. The method includes forming an inhibitor on a base wafer whose surface is entirely or partially a silicon crystal plane; forming, in the inhibitor, an opening that reaches the silicon crystal plane; forming, by epitaxial growth, a first crystal layer made of $Si_xGe_{1-x}$ ($0 \leq x < 1$) on the silicon crystal plane that is exposed in the opening; forming, by epitaxial growth, on an upper surface of the first crystal layer, a second crystal layer made of a III-V Group compound semiconductor that has a band gap width larger than a band gap width of the first crystal layer; and forming, on the inhibitor and an upper surface of the second crystal layer, a metal layer such that the metal layer is in contact with a part of the first crystal layer.

The method may further include forming an insulating portion in the metal layer on the second crystal layer. The insulating portion may be formed by anodizing a part of the metal layer.

According to the fourth aspect related to the present invention, provided is a method of manufacturing a semiconductor wafer. The method includes forming an inhibitor on a base wafer whose surface is entirely or partially a silicon crystal plane; forming, in the inhibitor, an opening that reaches the silicon crystal plane; forming, by epitaxial growth, a first crystal layer made of $Si_xGe_{1-x}$ (0≤x<1) on the silicon crystal plane that is exposed in the opening; forming, by epitaxial growth, on an upper surface of the first crystal layer, a second crystal layer made of a III-V Group compound semiconductor that has a band gap width larger than a band gap width of the first crystal layer; and forming a pair of metal layers that are in contact with the first crystal layer and the second crystal layer such that the metal layers are separated from each other. The method may further include filling a space between the pair of the metal layers with an insulator.

In the third aspect and the fourth aspect described above, the method may further include annealing the whole of the semiconductor wafer including the first crystal layer, the second crystal layer and the metal layer after the metal layers are formed. The annealing is preferably performed at a temperature in a range of 200° C. to 500° C. and in an atmosphere containing one or more gases selected from the group consisting of hydrogen, nitrogen and argon.

MODE FOR CARRYING OUT THE INVENTION

Figure 1:
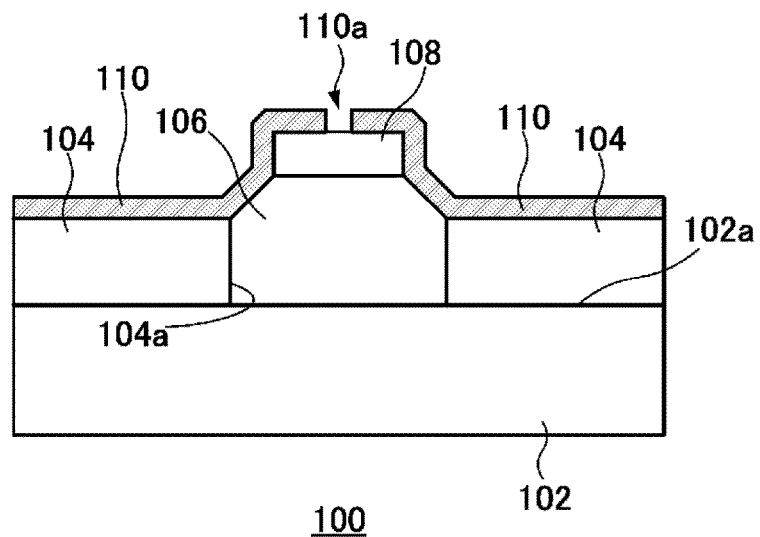
FIG. 1 is a sectional view of a semiconductor wafer 100.

FIG. 1 is a sectional view of a semiconductor wafer 100. The semiconductor wafer 100 includes a base wafer 102, an inhibitor 104, a first crystal layer 106, a second crystal layer 108, and a pair of metal layers 110.

The base wafer 102 has a surface the whole or a part of which is a silicon crystal plane 102a. An example of a wafer whose surface is partially or entirely a silicon crystal includes a silicon wafer and a silicon-on-insulator (SOI) wafer. It is preferable that a silicon wafer be used as the base wafer 102. As the base wafer 102 whose surface is partially or entirely a silicon crystal is used, it is not necessary to use an expensive compound semiconductor crystal wafer. Moreover, using a silicon wafer as the base wafer 102 enables utilizing conventional manufacturing processes and manufacturing apparatuses having been used in silicon wafer processes. Furthermore, it is possible to use a larger wafer compared with a compound semiconductor wafer, and therefore a manufacturing cost can be reduced.

The inhibitor 104 is positioned on the base wafer 102 and has an opening 104a that reaches the silicon crystal plane 102a. The inhibitor 104 inhibits crystal growth. The inhibitor 104 can be made of silicon oxide, silicon nitride, silicon oxynitride, aluminum oxide and the like. The size of the opening 104a is preferably set to 30 μm or less. Here, when a region of the base wafer 102 exposed in the opening 104a is a square, "the size of the opening 104a" refers to the length of one side of the square, when the region is a rectangular, the length of a shorter side of the rectangular, when the region is an ellipse, the length of a minor axis, and when the region is a circle, the length of the diameter of the circle.

The first crystal layer 106 is positioned on the silicon crystal plane 102a exposed in the opening 104a, and is made of $Si_xGe_{1-x}$ (0≤x<1). The first crystal layer 106 is preferably made of Ge. Because the first crystal layer 106 is formed inside the small opening 104a whose size is 30 μm or less, it can be formed with less crystal defects, in many cases, it can be formed without any defects in crystal. Consequently, the quality of the first crystal layer 106 can be increased while defects in the second crystal layer 108 formed on the first crystal layer 106 can be decreased or eliminated, resulting in an enhanced quality of the second crystal layer 108. The first crystal layer 106 may be grown directly on the silicon crystal plane 102a or grown with a Si buffer layer or a SiGe buffer layer interposed therebetween.

The first crystal layer 106 protrudes toward a side opposite to a face where the inhibitor 104 is in contact with the base wafer 102. In other words, the thickness of the first crystal layer 106 is larger than the thickness of the inhibitor 104. The first crystal layer 106 has metal contact surfaces which are in contact with a pair of metal layers 110 between a face being in contact with the inhibitor 104 and a face opposite to a face being in contact with the base wafer 102. The first crystal layer 106 in this example has the metal contact surfaces between the face being in contact with the inhibitor 104 and a face being in contact with the second crystal layer 108. The metal contact surfaces may be slanted to a direction in which the first crystal layer 106 and the second crystal layer 108 are stacked to each other. The metal contact surfaces may include a face parallel to the face where the first crystal layer 106 is in contact with the inhibitor 104, and another face parallel to the face where the first crystal layer 106 is in contact with the base wafer 102.

The first crystal layer 106 may be dented with respect to the face where the inhibitor 104 is in contact with the base wafer 102. In other words, the thickness of the first layer 106 may be smaller than the thickness of the inhibitor 104. Even in this case, the first crystal layer 106 has metal contact surfaces that are in contact with a pair of metal layers 110 between a face being in contact with the inhibitor 104 and a face opposite to a face being in contact with the base wafer 102.

The second crystal layer 108 is positioned on the first crystal layer 106 and is made of a III-V Group compound semiconductor that has a band gap width larger than a band gap width of the first crystal layer 106. The second crystal layer 108 is preferably made of InGaAlAsP. Since the second crystal layer 108 is formed on the first crystal layer 106 that has a fine crystallinity, it can be formed with less crystal defects, in many cases, it can be formed without any defects in crystal.

The pair of metal layers 110 are positioned on the inhibitor 104 and the second crystal layer 108. Each of the metal layers 110 of the pair of the metal layers 110 is in contact with the first crystal layer 106 and the second crystal layer 108. For instance, the metal layer 110 is in contact with the metal contact surface of the first crystal layer 106, a lateral face of the second crystal layer 108, and a face opposite to the face where the second crystal 108 is in contact with the first crystal layer 106. The metal layers 110 of the pair of metal layers 110 are separated from each other by a space 110a between the metal layers 110 formed on the second crystal layer 108. The pair of metal layers 110 may be formed by patterning using, for example, photolithography and etching, and the space 110a may be formed during the patterning.

The above-described semiconductor wafer 100 can function as a photoconductive switch with the first crystal layer 106 and the second crystal layer 108 serving as photoconductive layers, and the pair of metal layers 110 serving as a pair of electrodes. Similarly, other semiconductor wafers described below can also function as photoconductive switches.

In the semiconductor wafer 100, the pair of metal layers 110 are each in contact with the first crystal layer 106 and the second crystal layer 108. Therefore, when a photoconductive switch is configured using the semiconductor wafer 100, photoexcited carriers generated at one or both of crystal layers of the first crystal layer 106 and the second crystal layer 108 can be conducted to both of the first crystal layer 106 and the second crystal layer 108. Consequently, the photoconductive switch configured using the semiconductor wafer 100 has a plurality of current paths, and therefore it is possible to increase a saturation light intensity of output current.

Moreover, in the semiconductor wafer 100, the first crystal layer 106 has a band gap width smaller than a band gap width of the second crystal layer 108. Thereby the first crystal layer 106 can absorb the light having wavelengths that are not absorbed by the second crystal layer 108, of among the light entering from the side of the second crystal layer 108. Consequently, the pair of metal layers 110 being each in contact with the first crystal layer 106 and the second crystal layer 108, the semiconductor wafer 100 can detect light with a wider region of wavelengths as compared to the case where the pair of metal layers 110 are in contact with only the second crystal layer 108.

Figure 2:
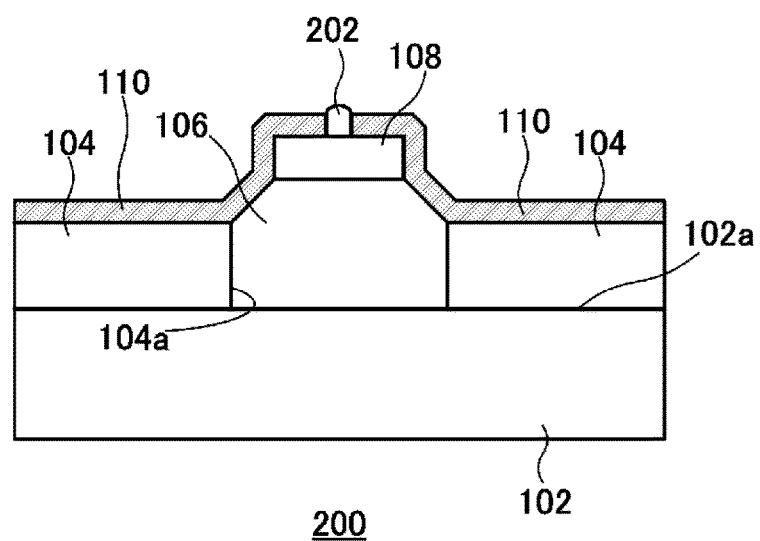
FIG. 2 is a sectional view of a semiconductor wafer 200.

FIG. 2 is a sectional view of a semiconductor 200. Whereas the semiconductor wafer 100 described above has the pair of metal layers 110 separated by the space 110a, the semiconductor wafer 200 has an insulating portion 202 which separates the metal layers 110 from each other. In other words, the pair of metal layers 110 are electrically separated by the insulating portion 202 positioned on the second crystal layer 108.

The insulating portion 202 can be one made of an oxide or nitride of a metal atom of the metal layers 110. When anode oxidization of the metal layer 110, which will be hereunder described, is performed, such insulating portion 202 can be formed. Alternatively, the insulating portion 202 may be formed by forming a space by patterning and then filling the space with an insulator. In this case, silicon oxide, silicon nitride, silicon oxynitride, aluminum oxide and the like is used as the insulator, and preferably silicon oxide is used as the insulator. Silicon oxide can be easily formed by deposition, spattering or the like, patterning of silicon oxide is also easy and selective growth of silicon oxide is also easy. Silicon oxide can also be formed through thermal oxidation of a silicon wafer, which is therefore superior in mass-production.

The length of a shorter side of the space 110a illustrated in FIG. 1 or the insulating portion 202 illustrated in FIG. 2 is, for example, 1 μm. It is preferable that the length of the shorter side of the space 110a or the insulating portion 202 be set to 100 nm or less. Here, the length of the shorter side of the space 110a or the insulating portion 202 corresponds to the shortest distance between the metal layers 110 of the pair of metal layers 110.

Figure 3:
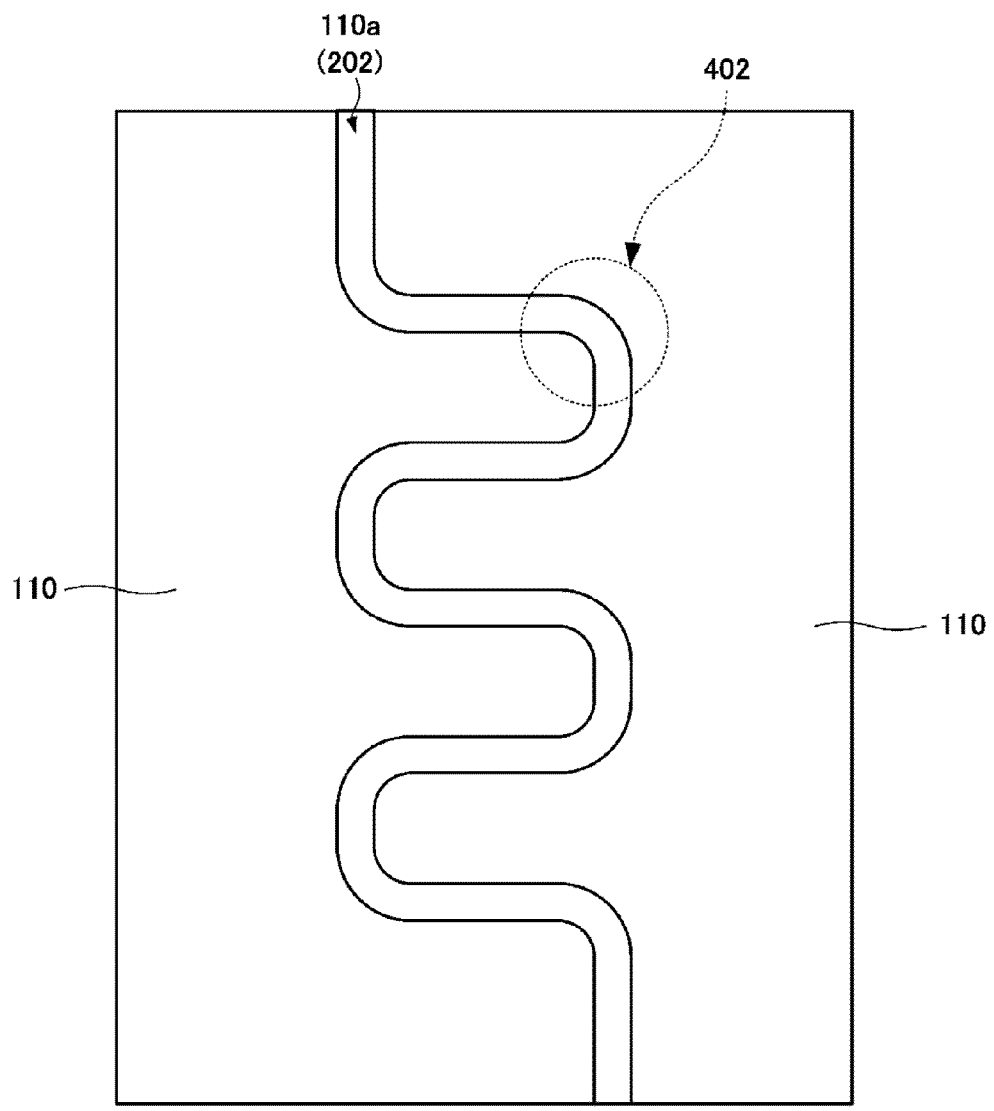
FIG. 3 is a top view of the semiconductor wafer 100 or the semiconductor wafer 200.

When the semiconductor wafer in FIG. 1 or FIG. 2 is viewed from the top, a planar shape of the space 110a or the insulating portion 202 may be a rectangle or narrow rectangle (elongated linear shape), alternatively the planar shape may be in a zigzag pattern such as a comb-like shape, as illustrated in FIG. 3. As it is preferable that an electric field between the metal layers 110 be uniform and concentration of the electric field should not occur when a voltage is applied to the pair of metal layers 110, the faces of the metal layers 110 that oppose to each other are preferably parallel to each other. When the shape of the space 110a or the insulating portion 202 is a zigzag pattern as illustrated in FIG. 3, a bend section 402 is preferably made to be arc-like shape. By forming such arc-like bend section, it is possible to restrain local electric-field concentration at the space 110a or the insulating portion 202.

The metal layers 110 can be made of a metal of a single atom selected from the group consisting of titanium, niobium, chromium, aluminum, hafnium and zirconium, or made of an alloy of two or more atoms selected from the group described above. The metal layers 110 are preferably made of a metal of a single atom selected from the group consisting of titanium, niobium, and chromium, or an alloy of two or more atoms selected from the group described above, and more preferably made of titanium. The metal layer 110 forms a schottky junction with at least one of the first crystal layer 106 and the second crystal layer 108. When the metal layer 110 forms a Schottky junction with the second crystal layer 108, the metal layer 110 may be in ohmic contact with the first crystal layer 106.

Figure 4:
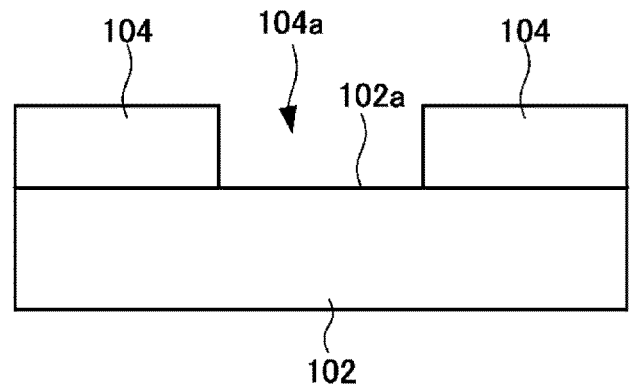
FIG. 4 illustrates a sectional view of the semiconductor wafer 200 during a manufacturing process.
Figure 5:
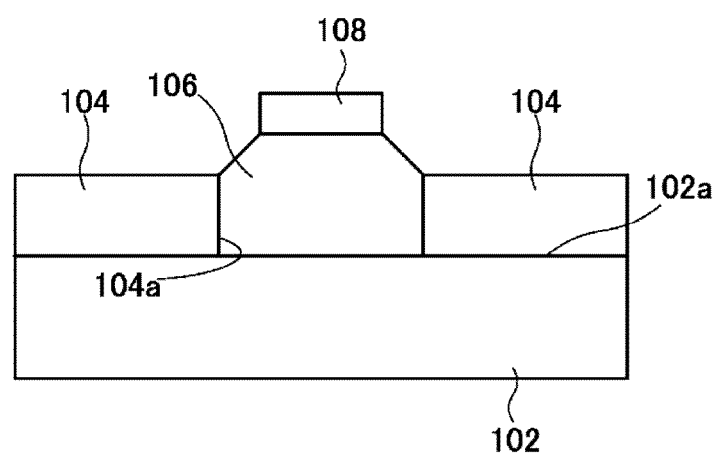
FIG. 5 illustrates a sectional view of the semiconductor wafer 200 during the manufacturing process.
Figure 6:
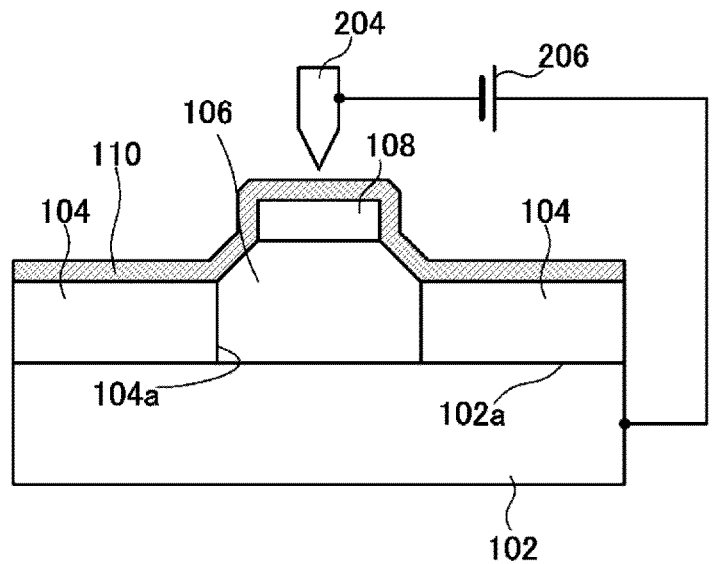
FIG. 6 illustrates a sectional view of the semiconductor wafer 200 during the manufacturing process.

FIGS. 4-6 illustrate sectional views of the semiconductor wafer 200 during a manufacturing process. Referring to FIG. 4, the inhibitor 104 is formed on the base wafer 102, and the opening 104a that reaches the silicon crystal plane 102a is formed in the inhibitor 104. Referring next to FIG. 5, the first crystal layer 106 made of $Si_xGe_{1-x}$ ($0 \leq x < 1$) is formed by an epitaxial growth method on the silicon crystal plane 102a exposed by the opening 104a. The second crystal layer 108, which is made of a III-V Group compound semiconductor that has a band gap width larger than the band gap width of the first crystal layer 106, is then formed on the upper surface of the first crystal layer 106 by an epitaxial growth method.

Chemical Vapor Deposition (CVD) methods or Metal Organic Chemical Vapor Deposition (MOCVD) methods can be used for the epitaxial growth of the first crystal layer 106 and the second crystal layer 108. In a CVD method, $GeH_4$ (germane) can be used for a Ge source, and $SiH_4$ (silane) or $Si_2H_6$ (disilane) can be used for a Si source. In a MOCVD method, TMIn (trimethyl-indium) can be used for an In source, TMGa (trimethyl-gallium) can be used for a Ga source, TMAl (trimethyl-aluminum) can be used for an Al source, $AsH_3$ (arsine) can be used for an As source, $PH_3$ (phosphine) can be used for a P source, tBuGe (tertiary-butyl-germane) can be used for a Ge source, and TMeSi (tetra-methyl-silane) can be used for a Si source. Hydrogen can be used for a carrier gas. A reaction temperature can be adequately selected within a range from 300° C. to 900° C., more preferably within a range from 450° C. to 750° C. By selecting a reaction time adequately, the thickness of an epitaxially-grown layer can be controlled.

After the second crystal layer 108 is formed, the metal layer 110 that is in contact with the upper surfaces of the inhibitor 104 and the second crystal layer 108 and a part of the first crystal layer 106 is formed as illustrated in FIG. 6. A part of the metal layer 110 is then anodized. Anodic oxidization of the part of the metal layer 110 can be performed by bringing a probe 204 to which a negative voltage is applied closer to the surface of the metal layer 110, and then applying the negative current to the metal layer 110 from a tip of the probe 204. The negative voltage application to the probe 204 can be conducted by a DC power supply 206 which outputs a negative voltage, using an electric potential of the base wafer 102 as a standard. A region to be oxidized can be selected by moving the probe 204 to a desired region. Through such anodic oxidization, the insulating portion 202 can be formed in the metal layer 110 on the second crystal layer 108. Through the above-described process, the semiconductor wafer 200 illustrated in FIG. 2 can be produced. Here, the metal layer 110 can be formed into a pair of electrodes by patterning the metal layer 110 adequately, which can function as a photoconductive switch.

The opening 104a is formed in the inhibitor 104 formed on the base wafer 102 and the first crystal layer 106 is then formed inside the opening 104a by a selective-epitaxial growth method, whereby a slanted crystal plane is prone to be formed on a lateral face of the first crystal layer 106, and the contact with the metal layer 110 can be easily obtained. For this reason, it is preferable that the first crystal layer 106 be formed within the opening 104a of the inhibitor 104 by selective epitaxial growth. When the base wafer 102 is a Si wafer having the (100) plane as the main plane and $Si_xGe_{1-x}$ (0≤x<1) is formed as the first crystal layer 106, the (311) crystal plane is formed as the slanted crystal plane of the first crystal layer 106. The (311) plane has an adequate inclination and therefore it can be preferably utilized as the above-described metal contact surface.

Figure 7:
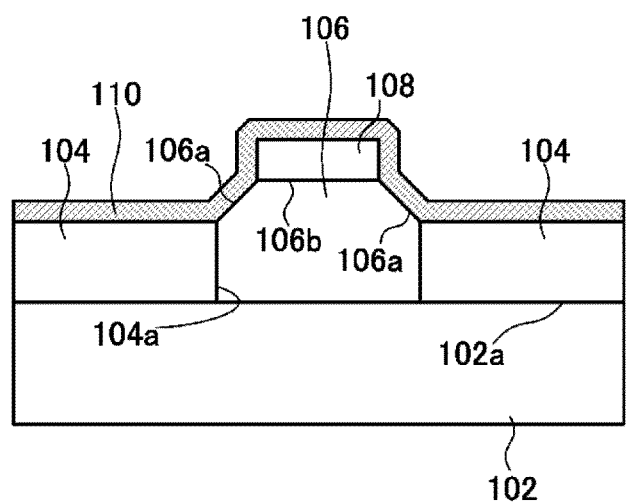
FIG. 7 illustrates a sectional view of the semiconductor wafer 200 during the manufacturing process.

Here, the phrase "the metal layer 110 is in contact with a part of the first crystal layer 106" includes the following cases. Referring to FIG. 7, when the first layer 106 is formed such that its upper face is positioned higher than the surface of the inhibitor 104, at least a part of the lateral face 106a of the first crystal layer 106 is consequently positioned higher than the surface of the inhibitor 104, and the second crystal layer 108 is selectively grown on and upper face 106b of the first crystal layer 106, the metal layer 110 is in contact with the lateral face 106a of the first crystal layer 106. Such case is one example of "in contact with a part."

Figure 8:
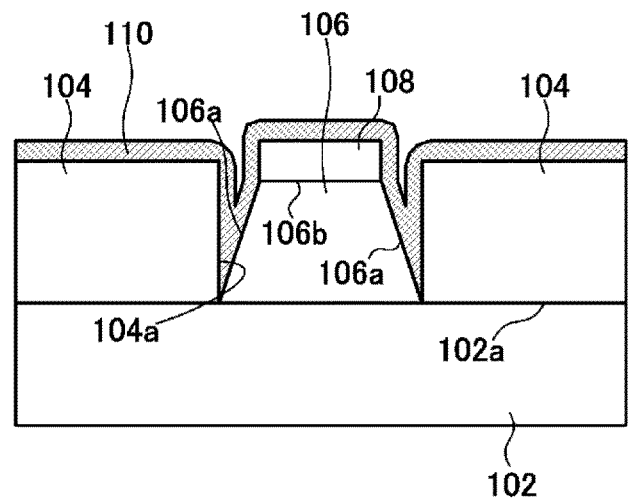
FIG. 8 illustrates a sectional view of another exemplary semiconductor wafer 200 during a manufacturing process.

Referring to FIG. 8, when the first crystal layer 106 is formed in a trapezoid shape inside the opening 104a, the second crystal layer 108 is selectively grown on the upper face 106b of the trapezoid first crystal layer 106, and the metal layer 110 is formed conformally till the bottom of the trapezoid first crystal layer 106, the metal layer 110 is in contact with the lateral face 106a of the trapezoid first crystal layer 106. Such case is also one example of "in contact with a part."

Figure 9:
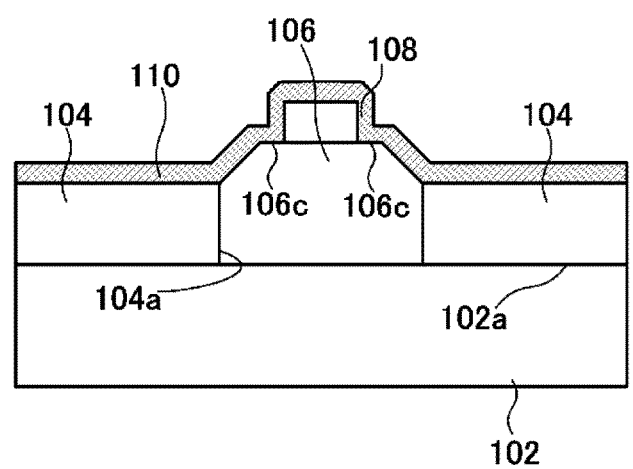
FIG. 9 illustrates a sectional view of still another exemplary semiconductor wafer 200 during a manufacturing process.

Referring to FIG. 9, when the second crystal layer 108 is formed on the first crystal layer 106 and a portion 106c of the upper face of the first crystal layer 106 is exposed by removing a part of the second crystal layer 108 through etching, the metal layer 110 is in contact with the exposed portion 106c of the upper face of the first crystal layer 106. Such case is also one example of "in contact with a part."

It is preferable that the first crystal layer 106 be annealed. The first crystal layer 106 can be formed with a fine crystallinity through annealing. Moreover, the angle of the slanted crystal plane of the first crystal layer 106 can be adjusted through annealing to form the space between the inhibitor 104 and the first crystal layer 106, and consequently the metal layer 110 and the first crystal layer 106 can be brought into contact with each other in a large area. When the Si wafer having the (100) plane as the main plane is used as the base wafer 102 and $Si_xGe_{1-x}$ (0≤x<1) is formed as the first crystal layer 106, an annealing temperature is preferably set within a range of from 600° C. to 900° C. The case where the annealing temperature is below 600° C. is not preferable because the quality of the crystal cannot be sufficiently improved and crystal defects would remain, and whereas the case where the annealing temperature is above 900° C. is not preferable because the upper face of the first crystal layer 106 becomes uneven and the second crystal layer 108 cannot be grown thereon in fine quality. When the temperature is in the range of from 600° C. to 900° C., it is possible to improve the crystal quality and the slanted crystal plane can be obtained with an adequate angle thereof.

As an alternative method of forming the insulating portion 202, a part of the metal layer 110 may be removed through etching (patterning) such that the metal layer 110 on the second crystal layer 108 may be divided into two sections, and then the insulating portion 202 may be formed in the region where the metal layer 110 is removed.

In the etching of the inhibitor 104 to form the opening 104a, a wet-etching method can be used. Through the wet-etching method, the shape of the opening 104a becomes less sharp and therefore the first crystal layer 106 can also be grown on the inhibitor 104 in the lateral direction. In this case, a lateral face of the first crystal layer 106 that is grown in the lateral direction on the inhibitor 104 can be in contact with the metal layer 110.

Furthermore, after the first crystal layer 106, the second crystal layer 108, and the metal layer 110 are formed, annealing (sintering) can be performed. Annealing (sintering) is preferably performed under hydrogen atmosphere and a temperature within a range of from 200° C. to 500° C. Through the annealing (sintering), the Schottky junction is secured at the contact between the second crystal layer 108 and the metal layer 110, and the contact between the first crystal layer 106 and the metal layer 110 can be made as an ohmic contact. The contact between the second crystal layer 108 and the metal layer 110 is made as the Schottky junction, whereby sensitivity of the photoconductive switch can be increased. The contact between the first crystal layer 106 and the metal layer 110 is made as the ohmic contact, the saturation current of the photoconductive switch can be increased. The same effect as the above-described annealing (sintering) can also be obtained by exposing the surfaces of the first crystal layer 106 and the second crystal layer 108 with a hydrogen radical atmosphere after the first crystal layer 106 and the second crystal layer 108 are formed and before the metal layer 110 is formed. The same effect can also be obtained by immersing the semiconductor wafer in HCl or HF after the first crystal layer 106 and the second crystal layer 108 are formed and before the metal layer 110 is formed.

Figure 10:
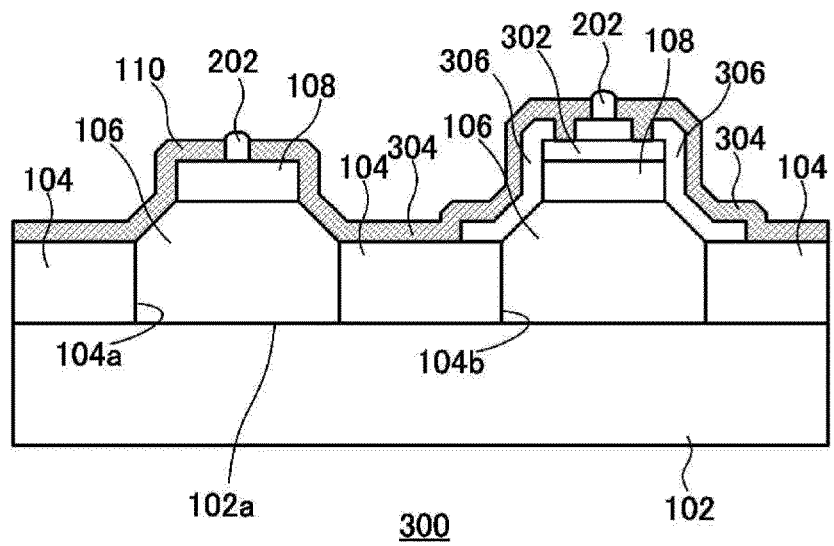
FIG. 10 is a sectional view of a semiconductor wafer 300.

FIG. 10 is a sectional view of a semiconductor wafer 300. In the semiconductor wafer 300, the inhibitor 104 has another opening 104b at a position other than the opening 104a in which the photoconductive switch is positioned, and the first crystal layer 106 and the second crystal layer 108 are provided at said another opening 104b. The semiconductor wafer 300 further has another crystal layer 302 formed on the second crystal layer 108 positioned at said another opening 104b, and an active element that includes said another crystal layer 302 as an active layer. Here, the active element may include the second crystal layer 108 as the active layer.

The photoconductive switch and the active element are connected to each other via a wiring line 304 positioned on the inhibitor 104. The wiring line 304 is isolated by an insulating layer 306 from the first crystal layer 106 and the second crystal layer 108 positioned at the opening 104b. The wiring 304 may be further isolated on the second crystal layer 108 positioned at the opening 104b by the insulating portion 202. An example of the active element includes a High Electron Mobility Transistor (HEMT), a Heterojunction Bipolar Transistor (HBT), and a Hetero-Field Effect Transistor (HFET).

The first crystal layer 106 positioned at the opening 104a and the first crystal layer 106 positioned at the opening 104b may be simultaneously formed by the same epitaxial growth. The second crystal layer 108 positioned at the opening 104a and the second crystal layer 108 positioned at the opening 104b may be simultaneously formed by the same epitaxial growth. By forming the first crystal layers 106 or the second crystal layers 108 simultaneously through the same epitaxial growth, forming steps of the photoconductive switch and the active switch can be simplified and therefore the manufacturing cost can be reduced.

With the above-described semiconductor wafer 300, the photoconductive switch (MSM element) and active elements such as transistors can be integrated on the single base wafer 102. For instance, the wafer can be used for an application where a signal from the MSM element is amplified by an active element such as a transistor.

The single base wafer 102 can include a plurality of the above-described photoconductive switches (MSM elements) as a structure. In other words, the inhibitor 104 can have a plurality of the openings 104a, the plurality of the openings 104a each can have the first crystal layer 106 and the second crystal layer 108, and a plurality of the first crystal layers 106 and the second crystal layers 108 each can have a pair of the metal layers 110. Moreover, there can be included a plurality of photoconductive switches in which a the plurality of the first crystal layers 106 and the second crystal layers 108 each can be configured as a photoconductive layer, and a plurality of the pairs of metal layers 110 each can be configured as a pair of electrodes. The plurality of photoconductive switches can be arranged in an array.

Furthermore, the single base wafer 102 can include a plurality of the photoconductive switches (MSM elements) illustrated in FIG. 10 and active elements such as transistors, as a structure. In other words, when the inhibitor 104 has a plurality of the openings 104a, and a plurality of other openings 104b at different positions from the plurality of openings 104a, the photoconductive switch including the first crystal layer 106 and the second crystal layer 108 as photoconductive layers may be formed at each of the plurality of openings 104a, and an active element including the second crystal layer 108 or other crystal layer formed thereon as an active layer may be formed at each of the plurality of openings 104b. Each of the plurality of photoconductive switches positioned at the openings 104a and each of the plurality of active elements positioned at the openings 104b may be connected to each other through each of a plurality of wiring lines positioned on the inhibitor 104.

Moreover, a layer having a band gap larger than those of the first crystal layer 106 and the second crystal layer 108 may be layered between the first crystal layer 106 and the second crystal layer 108. This configuration can be used as a photoconductive switch that utilizes only the second crystal layer 108 as the photoconductive layer. In this configuration, photocarriers that are generated from light absorbed by the second crystal layer 108 would not flow into the first crystal layer 106, and therefore it is possible to detect only the current flowing through the second crystal layer 108 in which electronic carriers have a higher mobility and higher responsiveness than the first crystal layer 106. Accordingly, the responsiveness of the photoconductive switch is enhanced as compared with one in which the first crystal layer 106 and the second crystal layer 108 are in contact with each other.

EXAMPLE

A silicon oxide layer was formed on a silicon wafer by thermal oxidation, and an opening having a size of 30 μm (a square opening whose one side has a length of 30 μm) was formed in the silicon oxide layer by photolithography and etching. A Ge layer having the thickness of 2 μm was formed inside the opening by an epitaxial growth method. The Ge layer was then annealed for 10 cycles by a cyclic anneal method in which annealing is performed in two steps at 800° C. and 680° C., and subsequently a GaAs layer having the thickness of 500 nm was formed on the Ge layer by an epitaxial growth method. A Ti layer having the thickness of 6 nm was further formed by a vacuum deposition method. Subsequently, the Ti layer was anodized using an AFM (atomic force microscope) probe to form $TiO_x$.

Figure 11:
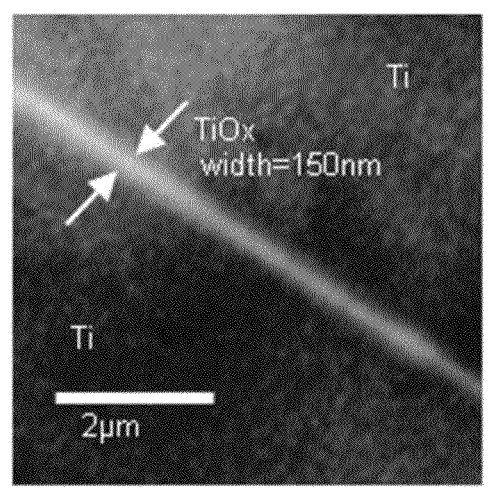
FIG. 11 is an SEM image of a semiconductor wafer according to an embodiment.
Figure 12:
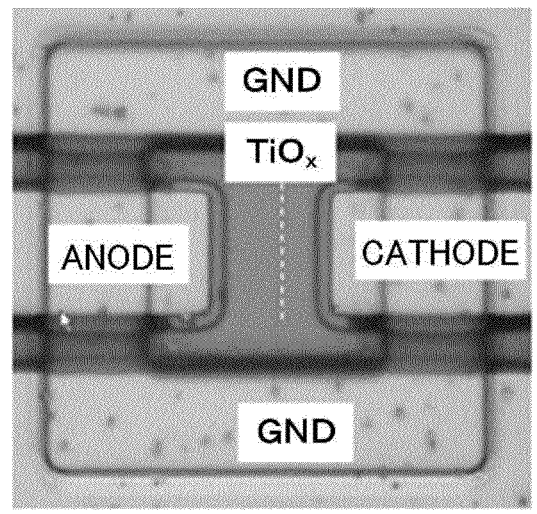
FIG. 12 is a micrograph of the top surface of an MSM element according to an embodiment.

FIG. 11 is a SEM image of the surface of the Ti layer after the anodization. It can be seen from the image that the insulating portion ($TiO_x$) having a shorter side with a length of 150 nm was formed. FIG. 12 is a micrograph of the top surface of an MSM element in which an anode and cathode were formed with the isolation of $TiO_x$. It can be seen from the micrograph that the element was accurately fabricated.

Figure 13:
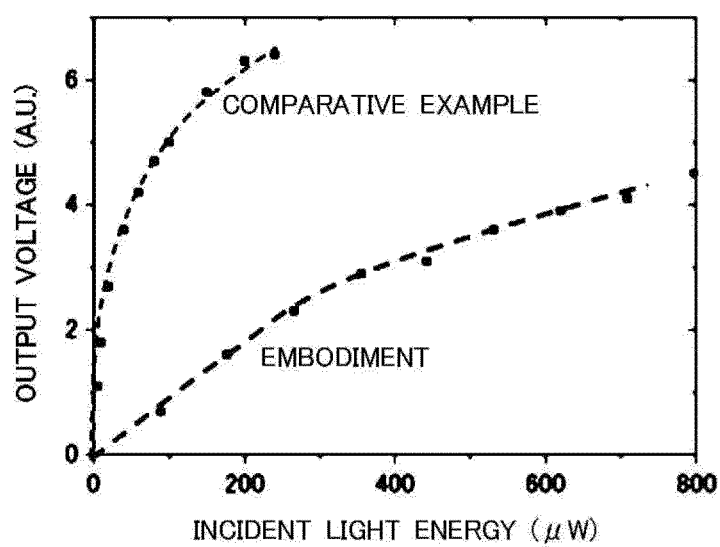
FIG. 13 illustrates an output voltage of the MSM element with respect to an incident light energy.

FIG. 13 is a graph illustrating an output voltage of the MSM element with respect to an incident light energy, together with a comparative example. Light having a 780 nm wavelength was used as an incident light for the MSM element, and an output voltage of the MSM element when the element was irradiated with the incident light energy was measured. It was found out that the resulting output voltage of the MSM element according to the embodiment would not be saturated until the incident light energy reached to 800 μW. A cross-sectional surface of the fabricated MSM element was observed through a scanning electron microscope, and it was confirmed that the anode electrode and the cathode electrode were in contact with the Ge layer, and separated to each other by the Ge layer.

Comparative Example

In a comparative example, an MSM element was fabricated in the same manner as the above-described embodiments except that a GaAs wafer was used instead of a silicon wafer and a GaAs layer was formed by an epitaxial growth method without forming a Ge layer. The relation between an incident light energy and an output voltage of the MSM element fabricated in the comparative example was examined, and it was found that the output voltage was saturated with 200 μW or less of the incident light energy, as illustrated in FIG. 13. In other words, the saturation light intensity of the MSM element according to the embodiment was found more than 4 times as large as that of the MSM element of the comparative example.

The conditions described in the above embodiment can be changed as follows. The MSM element can be fabricated in the same manner as the above embodiment except that an $In_{0.48}Ga_{0.52}$ layer is formed instead of the GaAs layer. When the relation between the incident light energy and the output voltage of the MSM element to be obtained is examined in the same manner as the embodiment, it is found that saturation of the output voltage is refrained. Alternatively, the MSM element can be fabricated in the same manner as the embodiment except that an InGaAsP having a wavelength of 1.55 μm as an absorption edge is formed instead of the GaAs layer. When the relation between the incident light energy and the output voltage of the MSM element to be obtained is examined in the same manner as the embodiment, it is found that saturation of the output voltage is refrained. Alternatively, the MSM element can be fabricated in the same manner as the embodiment except that an Nb layer is formed instead of the Ti layer. When the relation between the incident light energy and the output voltage of the MSM element to be obtained is examined in the same manner as Embodiment 1, it is found that saturation of the output voltage is refrained. Alternatively, the MSM element can be fabricated in the same manner as the embodiment except that a Cr layer is formed instead of the Ti layer. When the relation between the incident light energy and the output voltage of the MSM element is examined in the same manner as the embodiment, it is found that saturation of the output voltage is refrained.

In the specification, the case where a first element such as a layer, region or wafer is positioned on a second element can include the case where the first element is positioned indirectly on the second element with another element interposed therebetween, in addition to the case where the first element is positioned directly on the second element. Moreover, "the silicon crystal plane exposed in the opening" refers to a silicon crystal plane situated at the bottom of the opening.

DESCRIPTION OF REFERENCE NUMERALS 100 semiconductor wafer, 102 base wafer, 102a silicon crystal plane, 104 inhibitor, 104a opening, 104b another opening, 106 first crystal layer, 106a lateral surface, 106b upper surface, 106c a portion, 108 second crystal layer, 110 metal layer, 110a space, 200 semiconductor wafer, 202 insulating portion, 204 probe, 206 DC power supply, 300 semiconductor wafer, 302 crystal layer, 304 wiring line, 306 insulating layer, 402 bend section

The invention claimed is:

1. A semiconductor wafer comprising:
a base wafer whose surface is entirely or partially a silicon crystal plane;
an inhibitor positioned on the base wafer to inhibit crystal growth, and having an opening that reaches the silicon crystal plane;
a first crystal layer made of $Si_xGe_{1-x}$ (0≤x<1) and positioned on the silicon crystal plane that is exposed in the opening;
a second crystal layer positioned on the first crystal layer and made of a III-V Group compound semiconductor that has a band gap width larger than a band gap width of the first crystal layer; and
a pair of metal layers positioned on the inhibitor and the second crystal layer, wherein
the pair of the metal layers are each in contact with the first crystal layer and the second crystal layer.

2. The semiconductor wafer according to claim 1, further comprising:
an insulating portion electrically insulating the pair of the metal layers from each other and positioned on the second crystal layer, wherein
the insulating portion is made of an oxide or a nitride of a metal atom of the metal layers.

3. The semiconductor wafer according to claim 2, wherein a shorter side of the insulating portion is 1 μm or less.

4. The semiconductor wafer according to any one of claim 1, wherein
the metal layers are made of a metal of a single atom selected from the group consisting of titanium, niobium, chromium, aluminum, hafnium and zirconium, or made of an alloy of two or more atoms selected from the group described above.

5. The semiconductor wafer according to any one of claim 1, wherein
the inhibitor has a plurality of openings,
the first crystal layer and the second crystal layer are provided at each of the plurality of openings, and
a plurality of the first crystal layer and the second crystal layer each have the pair of metal layers.

6. A semiconductor device comprising the semiconductor wafer according to claim 1, the device comprising a photoconductive switch in which
the first crystal layer and the second crystal layer serve as photoconductive layers, and
the pair of the metal layers serve as a pair of electrodes.

7. The semiconductor device according to claim 6, wherein
the inhibitor has another opening at a position different from the opening in which the photoconductive switch is positioned,
the semiconductor device further comprising:
the first crystal layer and the second crystal layer positioned at said another opening; and
an active element in which the second crystal layer positioned at said another opening or another crystal layer formed on the second crystal layer positioned at said another opening serves as active layers, wherein
the photoconductive switch and the active element are connected to each other via a wiring line positioned on the inhibitor.

8. A semiconductor device comprising the semiconductor wafer according to claim 5, the device comprising a plurality of photoconductive switches in which
the plurality of first crystal layers and second crystal layers each serve as photoconductive layers, and a plurality of the pair of metal layers each serve as a pair of electrodes, wherein
the plurality of photoconductive switches are arranged in an array.

9. The semiconductor device according to claim 8, wherein
the inhibitor has a plurality of other openings at positions different from the openings in which the plurality of the photoconductive switches are positioned,
the semiconductor device further comprising:
the plurality of the first crystal layers and the second crystal layers each positioned at the plurality of said other openings; and
a plurality of active elements in which the second crystal layers each positioned at the plurality of said other openings or other crystal layers formed on the second crystal layers positioned at the plurality of said other openings serve as active layers, wherein
the plurality of photoconductive switches and the plurality of active elements are each connected to each other via a plurality of wiring lines positioned on the inhibitor.

10. A method of manufacturing a semiconductor wafer, the method comprising:
forming an inhibitor on a base wafer whose surface is entirely or partially a silicon crystal plane;

forming, in the inhibitor, an opening that reaches the silicon crystal plane;

forming, by epitaxial growth, a first crystal layer made of $Si_xGe_{1-x}$ (0≤x<1) on the silicon crystal plane that is exposed in the opening;

forming, by epitaxial growth, on an upper surface of the first crystal layer, a second crystal layer made of a III-V Group compound semiconductor that has a band gap width larger than a band gap width of the first crystal layer; and forming, on the inhibitor and an upper surface of the second crystal layer, a metal layer that is in contact with a part of the first crystal layer.

11. The method according to claim 10 of manufacturing a semiconductor wafer, further comprising:

forming an insulating portion in the metal layer on the second crystal layer, wherein the insulating portion is formed by anodizing a part of the metal layer.

12. A method of manufacturing a semiconductor wafer, the method comprising:

forming an inhibitor on a base wafer whose surface is entirely or partially a silicon crystal plane;

forming, in the inhibitor, an opening that reaches the silicon crystal plane;

forming, by epitaxial growth, a first crystal layer made of $Si_xGe_{1-x}$ (0≤x<1) on the silicon crystal plane that is exposed in the opening;

forming, by epitaxial growth, on an upper surface of the first crystal layer, a second crystal layer made of a III-V Group compound semiconductor that has a band gap width larger than a band gap width of the first crystal layer; and forming a pair of metal layers that are in contact with the first crystal layer and the second crystal layer such that the metal layers are separated from each other.

13. The method according to claim 12 of manufacturing a semiconductor wafer, the method further comprising:

filling a space between the pair of the metal layers with an insulator.

14. The method according to claim 10 of manufacturing a semiconductor wafer, the method further comprising:

annealing the whole of the semiconductor wafer including the first crystal layer, the second crystal layer, and the metal layer after the metal layer is formed.

15. The method according to claim 14 of manufacturing a semiconductor wafer, wherein the annealing is performed at a temperature in a range of 200° C. to 500° C. and in an atmosphere containing one or more gases selected from the group consisting of hydrogen, nitrogen and argon.

* * * * *